(12) United States Patent
Sun et al.

(10) Patent No.: US 12,040,021 B2
(45) Date of Patent: Jul. 16, 2024

(54) LAYOUT OF SEMICONDUCTOR STRUCTURE COMPRISING COLUMN DECODER

(71) Applicant: CHANGXIN MEMORY TECHNOLOGIES, INC., Hefei (CN)

(72) Inventors: Huijuan Sun, Hefei (CN); Jihoon Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 158 days.

(21) Appl. No.: 17/805,517

(22) Filed: Jun. 6, 2022

(65) Prior Publication Data

US 2023/0090028 A1 Mar. 23, 2023

Related U.S. Application Data

(63) Continuation of application No. PCT/CN2022/088839, filed on Apr. 24, 2022.

(30) Foreign Application Priority Data

Sep. 17, 2021 (CN) .......................... 202111095236.4

(51) Int. Cl.
*G11C 16/08* (2006.01)
*H10B 41/35* (2023.01)
*H10B 43/35* (2023.01)

(52) U.S. Cl.
CPC ............. *G11C 16/08* (2013.01); *H10B 41/35* (2023.02); *H10B 43/35* (2023.02)

(58) Field of Classification Search
CPC ........ G11C 16/08; G11C 16/24; H10B 41/35; H10B 43/35
See application file for complete search history.

(56) References Cited

U.S. PATENT DOCUMENTS

| 2006/0237706 A1 | 10/2006 | Enda et al. |
| 2006/0250848 A1 | 11/2006 | Maejima |

(Continued)

FOREIGN PATENT DOCUMENTS

| CN | 111755048 A | 10/2020 |
| WO | 2011043402 A1 | 4/2011 |

(Continued)

OTHER PUBLICATIONS

International Search Report cited in PCT/CN2022/088839 mailed Jun. 29, 2022, 8 pages.

*Primary Examiner* — Sultana Begum
(74) *Attorney, Agent, or Firm* — Kilpatrick Townsend & Stockton LLP

(57) ABSTRACT

Embodiments of the present disclosure include a layout of a semiconductor structure, including: a column decoder, wherein the column decoder includes a first P-type transistor region, a second P-type transistor region, a first N-type transistor region, a second N-type transistor region, and a NAND gate region. The first P-type transistor region is located above the first N-type transistor region, the second P-type transistor region is located above the first P-type transistor region, and the second N-type transistor region is located above the second P-type transistor region; the NAND gate region is adjacent to the first P-type transistor region, the second P-type transistor region, and the first N-type transistor region.

17 Claims, 6 Drawing Sheets

(56) References Cited

U.S. PATENT DOCUMENTS

| | | |
|---|---|---|
| 2009/0185407 A1 | 7/2009 | Park et al. |
| 2012/0014181 A1* | 1/2012 | Ajika .................. G11C 11/5671 |
| | | 365/185.11 |
| 2015/0206588 A1 | 7/2015 | Masuoka et al. |
| 2015/0357021 A1 | 12/2015 | Hush |
| 2020/0357458 A1* | 11/2020 | Sung .................... G11C 29/832 |

FOREIGN PATENT DOCUMENTS

| | | |
|---|---|---|
| WO | 2015071966 A1 | 5/2015 |
| WO | 2015097800 A1 | 7/2015 |

\* cited by examiner

LAYOUT OF SEMICONDUCTOR STRUCTURE COMPRISING COLUMN DECODER

CROSS-REFERENCE TO RELATED APPLICATIONS

This is a continuation of International Application No. PCT/CN2022/088839, filed on Apr. 24, 2022, which claims the priority to Chinese Patent Application No. 202111095236.4, titled "LAYOUT OF SEMICONDUCTOR STRUCTURE" and filed with the China National Intellectual Property Administration (CNIPA) on Sep. 17, 2021. The entire contents of International Application No. PCT/CN2022/088839 and Chinese Patent Application No. 202111095236.4 are incorporated herein by reference.

TECHNICAL FIELD

The present disclosure relates to, but is not limited to, a layout of a semiconductor structure

BACKGROUND

With higher requirements on the performance of semiconductor devices in the market, the semiconductor devices are becoming smaller. To meet the miniaturization trend of the semiconductor devices, the layout of semiconductor structures needs to be optimized.

SUMMARY

An embodiment of the present disclosure provides a layout of a semiconductor structure, including a column decoder, wherein
the column decoder includes a first P-type transistor region, a second P-type transistor region, a first N-type transistor region, a second N-type transistor region, and a NAND gate region; and
the first P-type transistor region is located above the first N-type transistor region, the second P-type transistor region is located above the first P-type transistor region, and the second N-type transistor region is located above the second P-type transistor region; the NAND gate region is adjacent to the first P-type transistor region, the second P-type transistor region, and the first N-type transistor region.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure.

Specific embodiments of the present application are shown by using the accompanying drawings and are described below in more detail. The accompanying drawings and text description are not intended to limit the scope of the concept of the present application in any manner, but to explain the concept of the present application for those skilled in the art with reference to specific embodiments.

DETAILED DESCRIPTION

Exemplary embodiments are described in detail herein, and examples thereof are represented in the accompanying drawings. When the following descriptions relate to the accompanying drawings, unless otherwise stated, same numerals in different accompanying drawings represent same or similar elements. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

Figure 1:
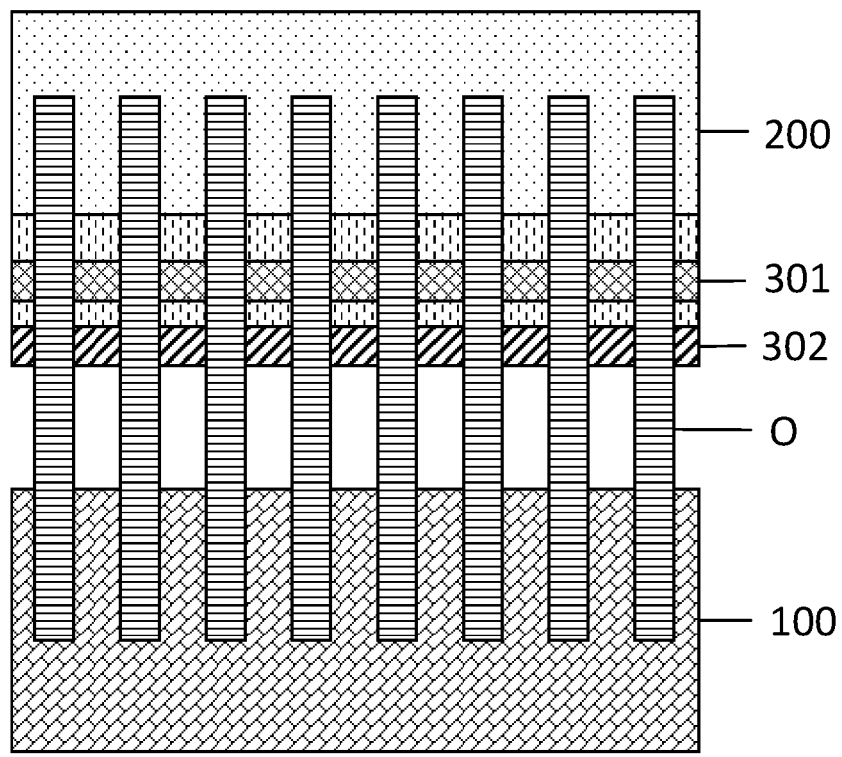
FIG. 1 is a layout of a semiconductor structure according to an embodiment of the present disclosure.

As shown in FIG. 1, a layout of a semiconductor structure provided by an embodiment of the present disclosure includes a column decoder 100 and a memory array 200. The memory array 200 is located above the column decoder 100, and an output metal line O of the column decoder 100 is connected to a column selection line of the memory array 200, to input a column selection signal to the memory array 200.

In an embodiment, a width of the memory array 200 on a direction from left to right may be equal to a width of the column decoder 100 on a direction from left to right, which can effectively reduce the size of the layout of the semiconductor structure.

In an embodiment, an N guard ring 302 of a third power supply terminal VPP and a P guard ring 301 of a ground terminal are arranged near the memory array, and the third power supply terminal VPP is configured to supply power to the memory array.

Figure 2:
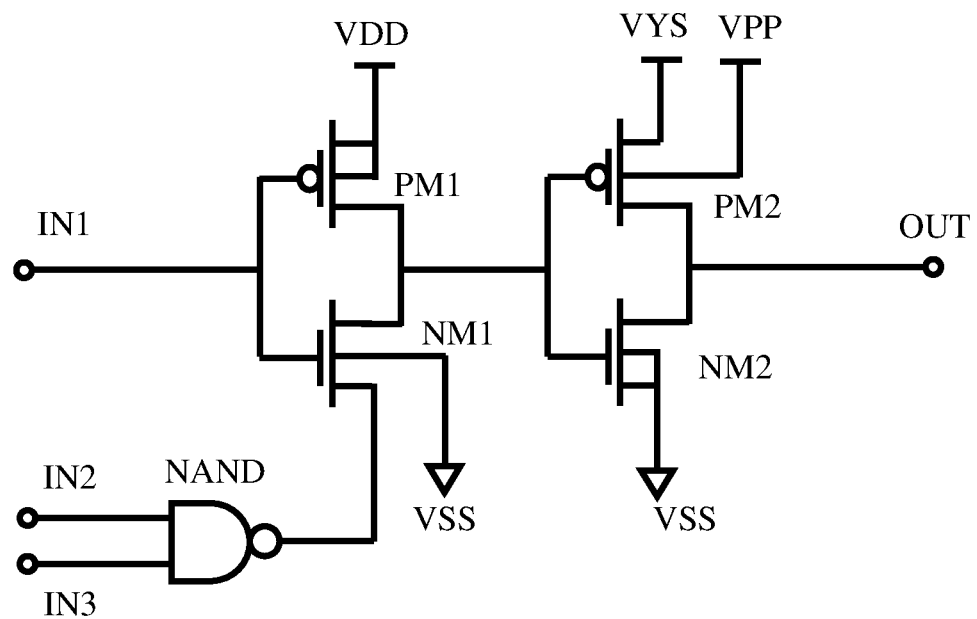
FIG. 2 is a circuit principle diagram of a column decoder according to an embodiment of the present disclosure.

As shown in FIG. 2, the column decoder 100 provided by an embodiment of the present disclosure includes a first P-type transistor PM1, a second P-type transistor PM2, a first N-type transistor NM1, a second N-type transistor NM2, and an NAND gate NAND.

A source terminal and a substrate terminal of the first P-type transistor PM1 are both connected to the first power supply terminal VDD. A drain terminal of the first N-type transistor NM1 is connected to a drain terminal of the first P-type transistor PM1. A gate terminal of the first N-type transistor NM1 and a gate terminal of the first P-type transistor PM1 are connected to form a first input terminal IN1 of the column decoder. A source terminal of the first N-type transistor NM1 is connected to an output terminal of the NAND gate NAND, and a substrate terminal of the first N-type transistor NM1 is connected to a ground terminal VSS. A first input terminal of the NAND gate NAND is a second input terminal IN2 of the column decoder, and a second input terminal of the NAND gate NAND is a third input terminal IN3 of the column decoder.

A source terminal of the second P-type transistor PM2 is connected to a second power supply terminal VYS, and a substrate terminal of the second P-type transistor PM2 connected to the third power supply terminal VPP. A drain terminal of the second N-type transistor NM2 and a drain terminal of the second P-type transistor PM2 are connected to form an output terminal OUT of the column decoder 100. A gate terminal of the second N-type transistor NM2 and a gate terminal of the second P-type transistor PM2 are connected to each other, and then connected to a drain terminal of the first P-type transistor PM1. A source terminal and a substrate terminal of the second N-type transistor NM2 are connected to the ground terminal VSS.

In an embodiment, further referring to FIG. 1, the output metal line O of the column decoder extends from bottom to top; one end of the output metal line is connected to the drain of the second P-type transistor PM2, and the other end of the output metal line is connected to the column selection line of the memory array.

Figure 3:
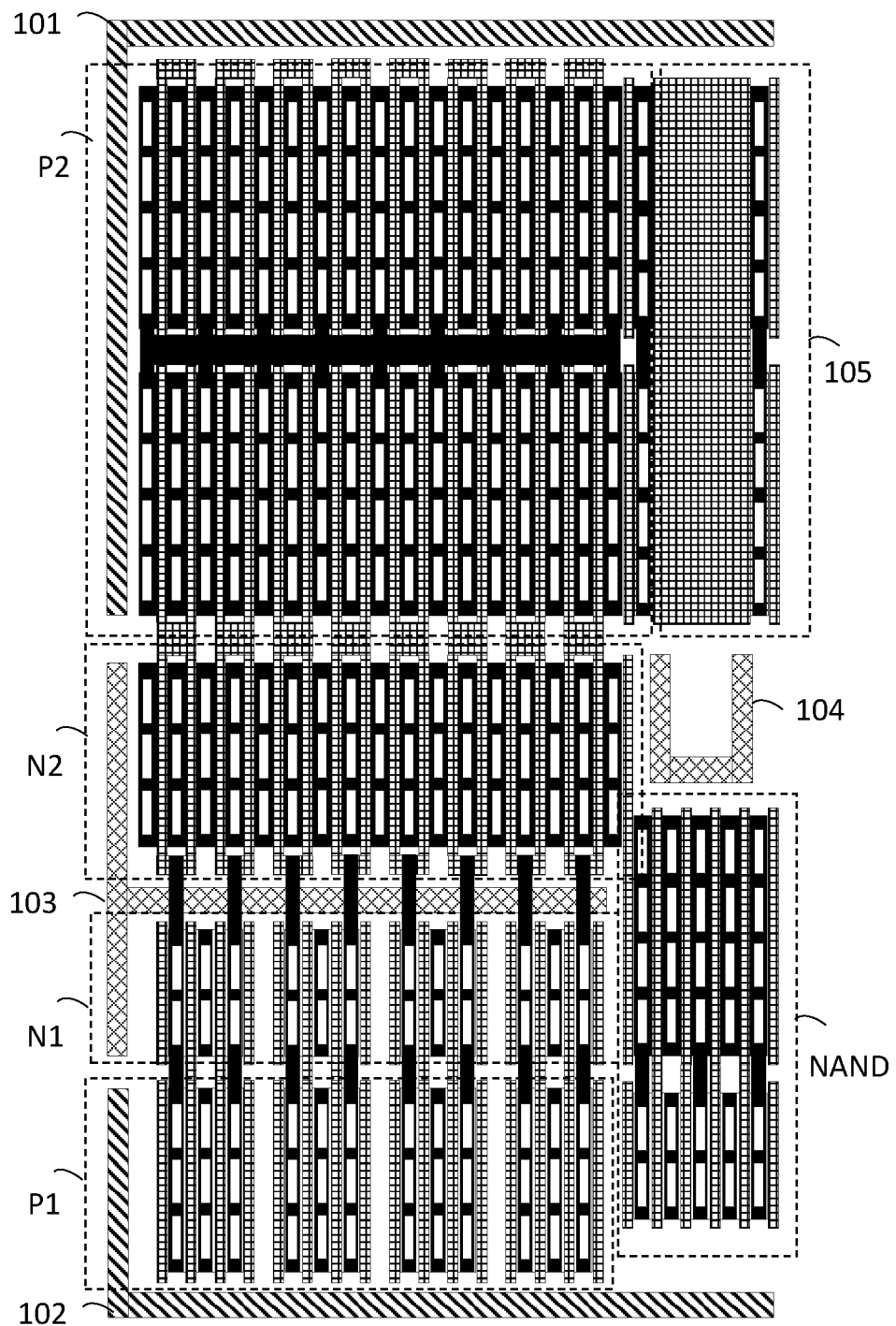
FIG. 3 is a layout of the column decoder in the embodiment shown in FIG. 2 according to the present disclosure.

FIG. 3 is a layout of the column decoder in the embodiment shown in FIG. 2. The layout of the column decoder includes a first P-type transistor region P1, a second P-type transistor region P2, a first N-type transistor region N1, a second N-type transistor region N2, and a NAND gate region NAND.

The second P-type transistor region P2 is located above the second N-type transistor region N2, the second N-type transistor region N2 is located above the first N-type transistor region N1, and the first N-type transistor region N1 is located above the first P-type transistor region P1. The NAND gate region NAND is arranged on the right side of the first N-type transistor region N1 and the first P-type transistor region P1.

Because the drain terminal of the first N-type transistor NM1 is connected to the drain terminal of the first P-type transistor PM1, the first N-type transistor region N1 is generally arranged adjacent to the first P-type transistor region P1. Moreover, because the drain terminal of the second N-type transistor NM2 and the drain terminal of the second P-type transistor PM2 are connected to the form the output terminal OUT of the column decoder 100, the second N-type transistor region N2 is generally arranged adjacent to the second P-type transistor region P2; in addition, the second N-type transistor region N2 and the second P-type transistor region P2 are located above the first N-type transistor region N1 and the first P-type transistor region P1, and the output metal line O extending from bottom to top is arranged above the second N-type transistor region N2 and the second P-type transistor region P2.

In an embodiment, a capacitor region 105 is arranged on the right side of the second P-type transistor region P2, to filter voltages provided by the first power supply terminal VDD to the third power supply terminal VPP, so as to stabilize the voltages provided by the first power supply terminal VDD to the third power supply terminal VPP.

In an embodiment, an L-shaped N guard ring 101 is arranged near the second P-type transistor region P2; a T-shaped P guard ring 103 is arranged between the first N-type transistor region N1 and the second N-type transistor region N2; and a U-shaped P guard ring 104 is arranged on the right side of the second N-type transistor region N2. An L-shaped P guard ring 102 is arranged near the first P-type transistor region P1.

In the foregoing embodiment, the voltage of the first power supply terminal VDD connected to the substrate terminal of the first P-type transistor PM1 is different from the voltage of the third power supply terminal VPP connected to the substrate terminal of the second P-type transistor PM2. During layout of the first P-type transistor PM1 and the second P-type transistor PM2 in the column decoder, a distance between an N-type well of the first P-type transistor PM1 and an N-type well of the second P-type transistor PM2 needs to be large enough to meet the minimum N-type well spacing. A distance between an N guard ring in the column selector and an N guard ring of the third power supply terminal VPP of the memory array is also large enough, so that a distance between the N-type well of the second P-type transistor PM2 and an N-type well in the memory array also meets the minimum N-type well spacing. Based on the above analysis, the layout of the semiconductor structure provided by the foregoing embodiment has a relatively large vertical height, and the entire semiconductor structure also has a relatively large size.

As shown in FIG. 4 to FIG. 7, an embodiment of the present disclosure provides a layout of a semiconductor structure. The layout of the semiconductor structure includes a column decoder. The column decoder includes a first P-type transistor region P1, a second P-type transistor region P2, a first N-type transistor region N1, a second N-type transistor region N2, and a NAND gate region.

The first P-type transistor region P1 is located above the first N-type transistor region N1, the second P-type transistor region P2 is located above the first P-type transistor region P1, and the second N-type transistor region N2 is located above the second P-type transistor region P2. The NAND gate region is adjacent to the first P-type transistor region P1, the second P-type transistor region P2, and the first N-type transistor region N1.

In the foregoing embodiment, by arranging the first P-type transistor region P1 and the second P-type transistor region P2 adjacent to each other, an increase in the distance between the P-type transistor and the N-type transistor caused by factors of the manufacturing process can be reduced. Moreover, all the P-type transistors can be surrounded by the guard ring, to achieve a better isolation effect, thereby providing a cleaner environment for the P-type transistors and reducing the impact of a latch-up effect.

The second N-type transistor region N2 is located above the second P-type transistor region P2, the first N-type transistor region N1 is located below the first P-type transistor region P1, so that a distance between an N-type well in the second P-type transistor PM2 and an N-type well in the memory array can still meet the minimum N-type well spacing even if the distance between the column decoder and the memory array is relatively small, thereby effectively reducing the vertical height of the semiconductor structure and reducing the size of the semiconductor structure. Moreover, the second N-type transistor region N2 and the second P-type transistor region P2 are arranged adjacent to each other, so that the drain terminal of the second N-type transistor NM2 can be connected to the drain terminal of the second P-type transistor PM2 conveniently.

In addition, a width of the column decoder on a direction from left to right is affected by a width of the memory array on a direction from left to right. By arranging the NAND gate region adjacent to the first P-type transistor region P1, the second P-type transistor region P2, and the first N-type transistor region N1, the width of the memory array on the direction from left to right can be fully utilized, to reduce the impact of the NAND gate region on the vertical height of the layout of the whole semiconductor structure, thereby further reducing the size of the semiconductor structure.

Figure 5:
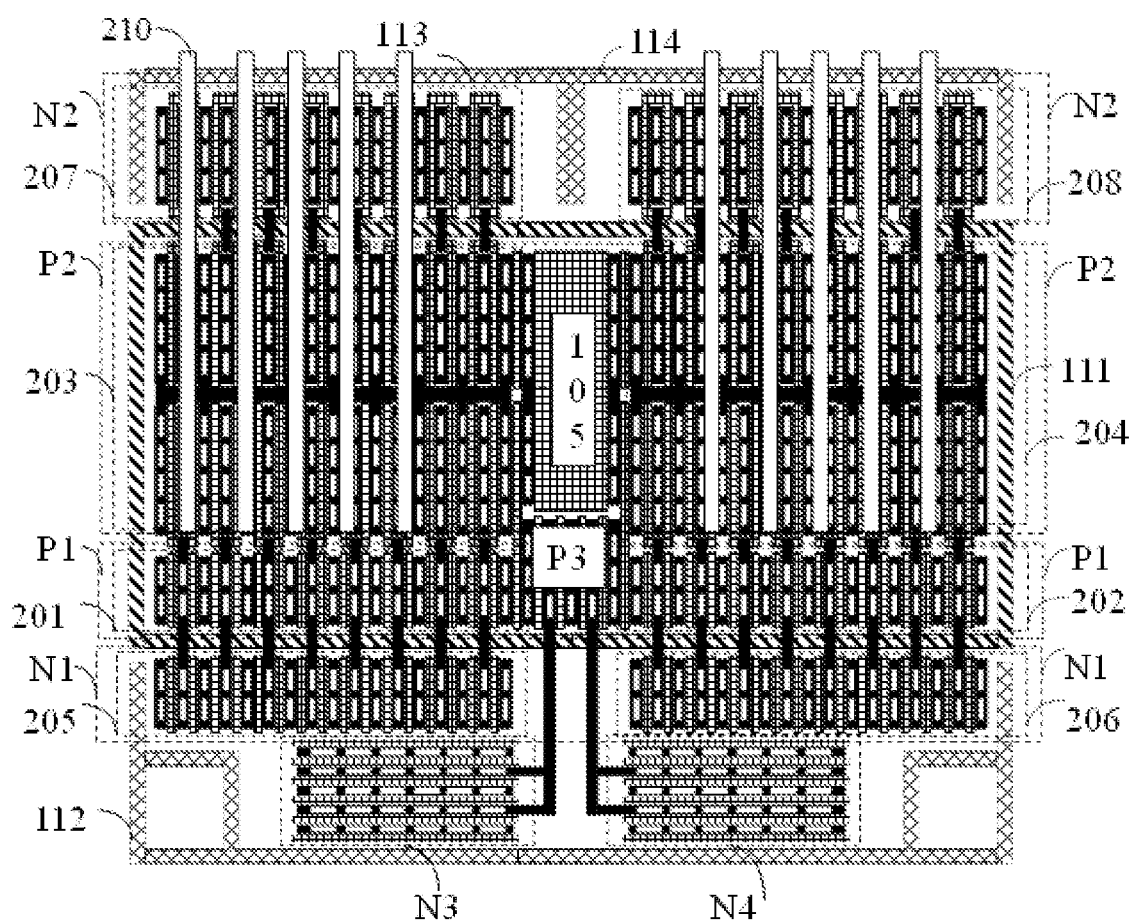
FIG. 5 is a layout of a column decoder according to another embodiment of the present disclosure.
Figure 7:
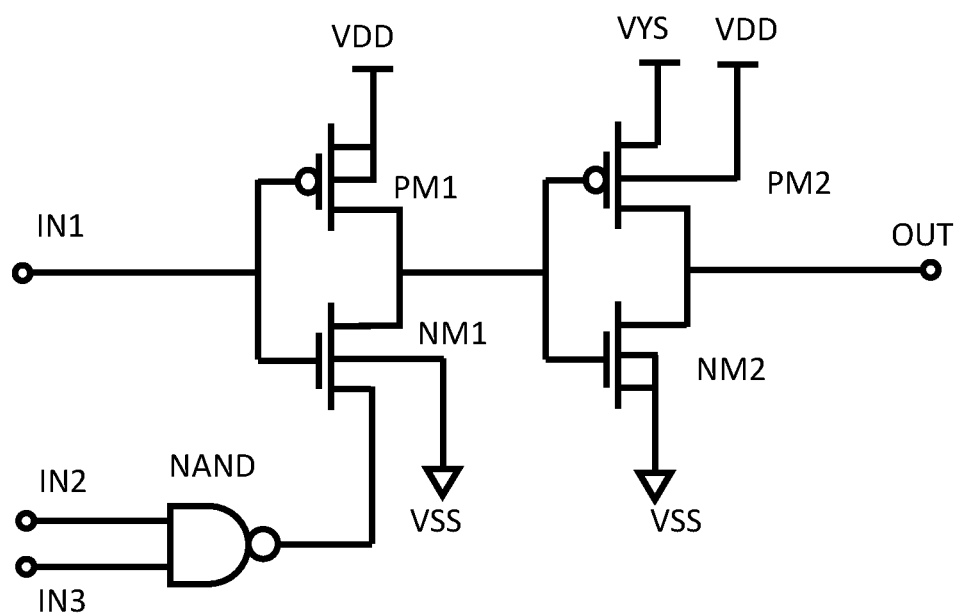
FIG. 7 is a circuit principle diagram of the column decoder in the embodiment shown in FIG. 4 to FIG. 6 according to the present disclosure.

In an embodiment, referring to FIG. 5 and FIG. 7, the column decoder further includes an output metal line 210. The output metal line 210 extends from bottom to top, one end of the output metal line 210 is connected to a drain of the second P-type transistor PM2, and the other end of the output metal line 210 is connected to a column selection line of the memory array. The output metal line 210 extends from bottom to top, which makes it easier to connect the output metal line 210 of the column decoder to the memory array.

In an embodiment, the semiconductor structure further includes a first metal layer in the top layer, a second metal layer in the middle layer, and a third metal layer in the third layer, and the output metal line 210 of the column decoder is located in the second metal layer. With such arrangement, the output metal line 210 of the column decoder can be connected to the column selection line of the memory array through the first metal layer, the second metal layer, and the third metal layer.

In an embodiment, for each transistor region, the number of multi-finger structures in each transistor region can be increased, and a width of the multi-finger structure in a gate extension direction can be reduced. The gate extension direction is a direction from top to bottom, so that the number of fingers of transistors is doubled without changing a total width of the transistors in the gate extension direction, and a width of a single transistor in the gate extension direction is reduced by half, thereby reducing the total height of the column decoder.

In an embodiment, referring to FIG. 7, a potential of a substrate terminal of the first P-type transistor region P1 is equal to a potential of a substrate terminal of the second P-type transistor region P2. For example, the substrate terminal of the first P-type transistor region P1 and the substrate terminal of the second P-type transistor region P2 are connected to the first power supply terminal VDD. Further, the source terminal of the first P-type transistor region P1 is connected to the first power supply terminal VDD, and the source terminal of the second P-type transistor region P2 is connected to the second power supply terminal VYS. In general cases, the voltage of the first power supply terminal VDD is the same as the voltage of the second power supply terminal VYS. The equal potentials of the substrate terminal of the first P-type transistor region P1 and the substrate terminal of the second P-type transistor region P2 does not affect turn-on or turn-off of the second P-type transistor PM2.

Figure 4:
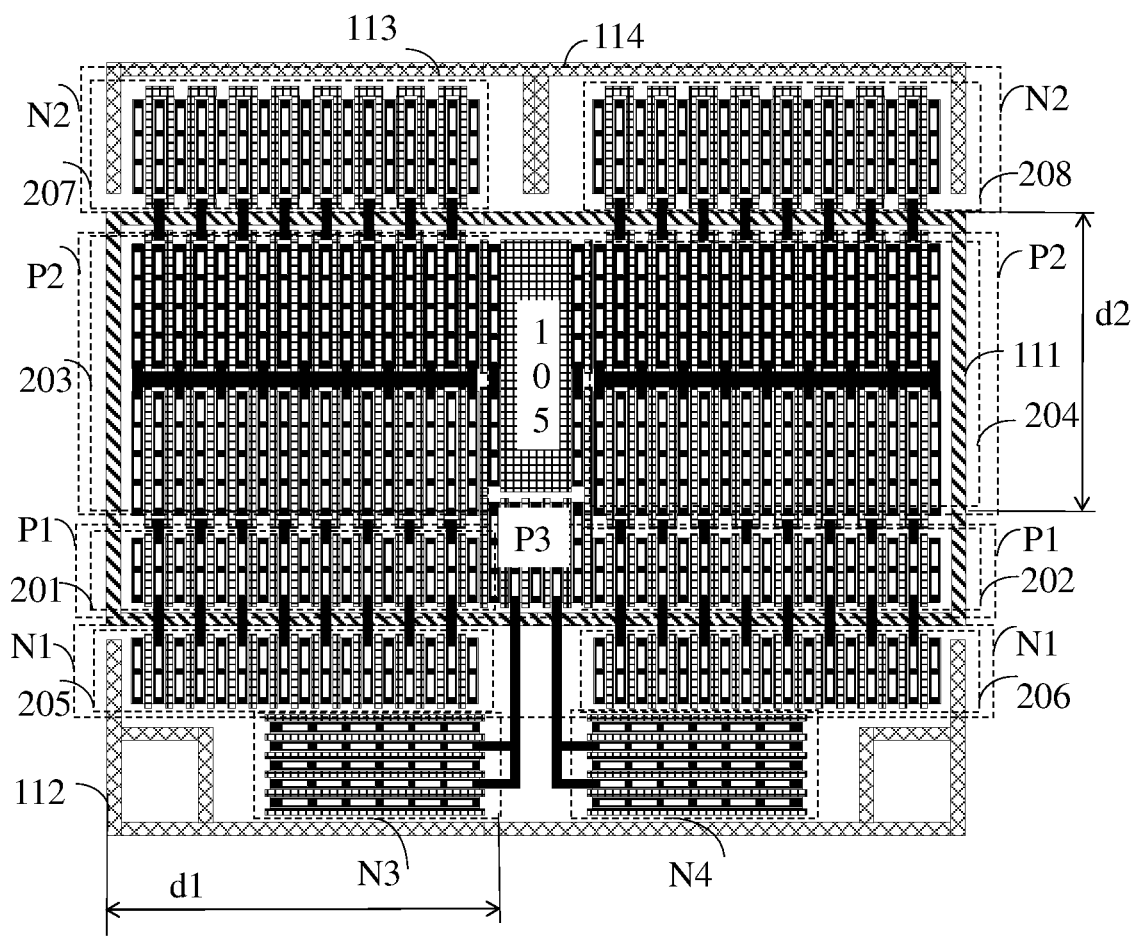
FIG. 4 is a layout of a column decoder according to an embodiment of the present disclosure.

In an embodiment, further referring to FIG. 4, the first P-type transistor region P1 includes a first region 201 and a second region 202. The first region 201 is horizontally symmetrical to the second region 202, and a gate extension direction of a P-type transistor in the first region 201 is the same as a gate extension direction of a P-type transistor in the second region 202. With such arrangement, a maximum distance d1 on a direction from left to right from the P-type transistor in the first region 201 to the boundary of the entire first P-type transistor region P1 is reduced, and a maximum distance on a direction from left to right from the P-type transistor in the second region 202 to the boundary of the entire first P-type transistor region P1 is reduced, which facilitates arrangement of the N guard ring on the periphery of the first P-type transistor PM1, thereby reducing the latch-up of the transistor.

The second P-type transistor region P2 includes a third region 203 and a fourth region 204. The third region 203 is horizontally symmetrical to the fourth region 204, and a gate extension direction of a P-type transistor in the third region 203 is the same as a gate extension direction of a P-type transistor in the fourth region 204. With such arrangement, a maximum distance d1 on a direction from left to right from the P-type transistor in the third region 203 to the boundary of the entire second P-type transistor region P2 is reduced, and a maximum distance on a direction from left to right from the P-type transistor in the fourth region 204 to the boundary of the entire second P-type transistor region P2 is reduced, which facilitates arrangement of the N guard ring on the periphery of the second P-type transistor PM2, thereby reducing the latch-up of the transistor.

In an embodiment, the first P-type transistor region P1 includes a first region 201 and a second region 202; the second P-type transistor region P2 includes a third region 203 and a fourth region 204. The first region 201 is horizontally symmetrical to the second region 202, and a gate extension direction of a P-type transistor in the first region 201 is the same as a gate extension direction of a P-type transistor in the second region 202. The third region 203 is horizontally symmetrical to the fourth region 204, and a gate extension direction of a P-type transistor in the third region 203 is the same as a gate extension direction of a P-type transistor in the fourth region 204. The gate extension direction of the P-type transistor in the first region 201 is the same as the gate extension direction of the P-type transistor in the third region 203, and a size of the first region 201 is different from that of the third region 203. The gate extension directions of the P-type transistors in the first region 201, second region 202, third region 203 and fourth region 204 are the same, which facilitates the manufacturing of the semiconductor structure. Because the first P-type transistor PM1 is located in an upper layer of the second P-type transistor PM2, the first P-type transistor PM1 and the second P-type transistor PM2 have different source-drain currents. By making the size of the first region 201 different from that of the third region 203, the first P-type transistor PM1 and the second P-type transistor PM2 can have different driving capabilities, to improve the working reliability of the semiconductor structure.

In an embodiment, the NAND gate region includes a third P-type transistor region P3. The third P-type transistor region P3 is located between the first region 201 and the second region 202, and is also located between the third region 203 and the fourth region 204. A gate extension direction of a P-type transistor in the third P-type transistor region P3 is the same as the gate extension direction of the P-type transistor in the first region 201. With such arrangement, a maximum distance on a direction from left to right from the transistor in the first P-type transistor region P1 to the boundary of the entire first P-type transistor region P1 is reduced, and a maximum distance on a direction from left to right from the transistor in the second P-type transistor region P2 to the boundary of the entire first P-type transistor region P1 is reduced, which facilitates arrangement of the N guard ring on the periphery of the first P-type transistor PM1, thereby reducing the latch-up of the transistor.

In an embodiment, the semiconductor structure further includes a capacitor region 105, and the NAND gate region includes a third P-type transistor region P3. The capacitor region 105 is located above the third P-type transistor region P3. Such arrangement helps the third P-type transistor to be connected to other transistors in the NAND gate region, to reduce the value of parasitic resistance. Moreover, the capacitor region is arranged between the first region 201 and the second region 202, and between the third region 203 and the fourth region 204. With such arrangement, a maximum distance on a direction from left to right from the transistor in the first P-type transistor region P1 to the boundary of the entire first P-type transistor region P1 is reduced, and a maximum distance on a direction from left to right from the transistor in the second P-type transistor region P2 to the boundary of the entire first P-type transistor region P1 is reduced, thereby reducing the latch-up of the transistor.

In an embodiment, the semiconductor structure further includes a closed N guard ring 111. The closed N guard ring 111 surrounds peripheries of the first P-type transistor region P1 and the second P-type transistor region P2. That is, the closed N guard ring 111 surrounds peripheries of the first region 201 and the second region 202, and surrounds peripheries of the third region 203 and the fourth region 204. With such arrangement, a maximum distance d1 on a direction from left to right from the P-type transistor in the first region 201 to the N guard ring 111 is less than half of the width of the N guard ring 111 in the direction from left to right. A maximum distance d2 on a direction from bottom to top between the P-type transistor in the first region 201 and the N guard ring 111 is less than half of a height of the N guard ring 111 on a direction from bottom to top, which better reduces the latch-up of the transistor. Moreover, the closed N guard ring 111 forms a closed isolation ring, which achieves a better isolation effect for the first P-type transistor region P1 and the second P-type transistor region P2 therein.

In an embodiment, the first N-type transistor region N1 includes a fifth region 205 and a sixth region 206. The fifth region 205 is horizontally symmetrical to the sixth region 206, and a gate extension direction of an N-type transistor in the fifth region 205 is the same as a gate extension direction of an N-type transistor in the sixth region 206. With such arrangement, a distance on a direction from left to right from the N-type transistor in the fifth region 205 to the boundary of the entire first N-type transistor region N1 is reduced, and a distance on a direction from left to right from the N-type transistor in the sixth region 206 to the boundary of the entire first N-type transistor region N1 is reduced, which facilitates arrangement of the P guard ring on the periphery of the first N-type transistor NM1, thereby reducing the latch-up of the transistor.

Figure 6:
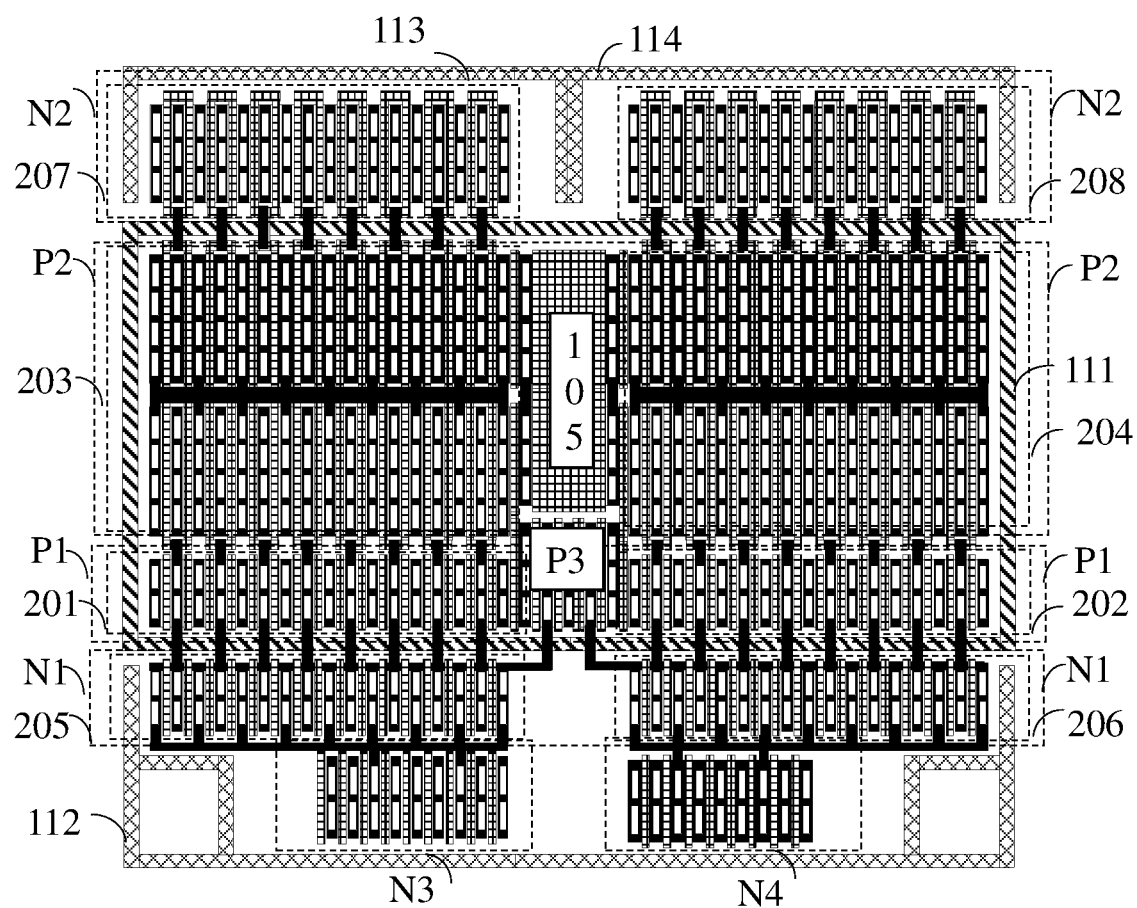
FIG. 6 is a layout of a column decoder according to another embodiment of the present disclosure.

In an embodiment, referring to FIG. 6, the NAND gate region further includes a third N-type transistor region N3 and a fourth N-type transistor region N4. The third N-type transistor region N3 is located below the fifth region 205, and the fourth N-type transistor region N4 is located below the sixth region 206.

A gate extension direction of an N-type transistor in the third N-type transistor region N3 is the same as a gate extension direction of an N-type transistor in the fifth region 205. Moreover, a width, in the gate extension direction, of the N-type transistor in the third N-type transistor region N3 is equal to a width, in the gate extension direction, of the N-type transistor in the fifth region 205.

A gate extension direction of an N-type transistor in the fourth N-type transistor region N4 is the same as a gate extension direction of an N-type transistor in the sixth region 206. Moreover, a width, in the gate extension direction, of the N-type transistor in the fourth N-type transistor region N4 is equal to a width, in the gate extension direction, of the N-type transistor in the sixth region 206.

The width, in the gate extension direction, of the N-type transistor in the third N-type transistor region N3 is determined according to a minimum transistor width in a Design Rule Check (DRC).

In the foregoing technical solution, the gate extension direction of the N-type transistor in the third N-type transistor region N3 is the same as the gate extension direction of the N-type transistor in the fifth region 205, and the gate extension direction of the N-type transistor in the fourth N-type transistor region N4 is the same as the gate extension direction of the N-type transistor in the sixth region 206, which helps simplify the manufacturing process of the semiconductor structure.

The width, in the gate extension direction, of the N-type transistor in the third N-type transistor region N3 is equal to the width, in the gate extension direction, of the N-type transistor in the fifth region 205, and the width, in the gate extension direction, of the N-type transistor in the fourth N-type transistor region N4 is equal to the width, in the gate extension direction, of the N-type transistor in the sixth region 206, which can reduce the height of the column decoder on the direction from top to bottom.

In an embodiment, further referring to FIG. 4 and FIG. 5, the NAND gate region further includes a third N-type transistor region N3 and a fourth N-type transistor region N4. The third N-type transistor region N3 is located below the fifth region 205, and the fourth N-type transistor region N4 is located below the sixth region 206.

A gate extension direction of an N-type transistor in the third N-type transistor region N3 is perpendicular to a gate extension direction of an N-type transistor in the fifth region 205. Moreover, a width, in the gate extension direction, of the N-type transistor in the third N-type transistor region N3 is greater than a width, in the gate extension direction, of the N-type transistor in the fifth region 205.

A gate extension direction of an N-type transistor in the fourth N-type transistor region N4 is perpendicular to a gate extension direction of an N-type transistor in the sixth region 206. Moreover, a width, in the gate extension direction, of the N-type transistor in the fourth N-type transistor region N4 is greater than a width, in the gate extension direction, of the N-type transistor in the sixth region 206.

In the foregoing technical solution, the gate extension direction of the N-type transistor in the third N-type transistor region N3 is perpendicular to the gate extension direction of the N-type transistor in the fifth region 205, and the gate extension direction of the N-type transistor in the fourth N-type transistor region N4 is perpendicular to the gate extension direction of the N-type transistor in the sixth region 206, which can increase the widths, in the gate extension direction, of the N-type transistors in the third N-type transistor region N3 and the fourth N-type transistor region N4, and reduce the number of fingers of the N-type transistors in the third N-type transistor region N3 and the fourth N-type transistor region N4 without increasing the height of the column decoder on the direction from top to bottom.

In an embodiment, the widths, in the gate extension direction, of the N-type transistors in the third N-type transistor region N3 and the fourth N-type transistor region N4 may be half of the width of the column decoder in the direction from left to right.

In an embodiment, the semiconductor structure further includes a first P guard ring 112 with a first opening. The first P guard ring 112 surrounds three sides of a region formed by the first N-type transistor region N1, the third N-type transistor region N3, and the fourth N-type transistor region N4, and the first opening faces towards the first P-type transistor region P1. With such arrangement, the first P guard ring 112 has a simple structure and is easy to manufacture, and can further effectively provide an isolation environment for the transistors in the first N-type transistor region N1, the third N-type transistor region N3, and the fourth N-type transistor region N4, thereby reducing the latch-up.

In an embodiment, the second N-type transistor region N2 includes a seventh region 207 and an eighth region 208. The seventh region 207 is horizontally symmetrical to the eighth region 208, and a gate extension direction of an N-type transistor in the seventh region 207 is the same as a gate extension direction of an N-type transistor in the eighth region 208. With such arrangement, a distance on a direction from left to right from the N-type transistor in the seventh region 207 to the boundary of the entire second N-type transistor region N2 is reduced, and a distance on a direction from left to right from the N-type transistor in the eighth region 208 to the boundary of the entire second N-type transistor region N2 is reduced, which facilitates arrangement of the P guard ring on the periphery of the second N-type transistor NM2, thereby reducing the latch-up of the transistor.

In an embodiment, the semiconductor structure further includes a first P guard ring 113 with a second opening and a third P guard ring 114 with a third opening. The first P guard ring 113 surrounds three sides of the seventh region 207, and the second opening faces towards the second P-type transistor region P2. The third P guard ring 114 surrounds three sides of the eighth region 208, and the third opening faces towards the second P-type transistor region P2. By arranging two P guard rings in the second N-type transistor region N2, the distance from the second N-type transistor region N2 to the P guard ring can be reduced, thereby providing an isolation environment for the transistor in the second N-type transistor region N2 and reducing the latch-up.

Those skilled in the art may easily figure out other implementation solutions of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that the present disclosure is not limited to the precise structures described above and shown in the accompanying drawings, and can be modified and changed in many ways without departing from the scope of the present disclosure. The scope of the present disclosure is defined by the appended claims.

The invention claimed is:

1. A layout of a semiconductor structure, comprising: a column decoder, wherein
the column decoder comprises a first P-type transistor region, a second P-type transistor region, a first N-type transistor region, a second N-type transistor region, and a NAND gate region;
the first P-type transistor region is located above the first N-type transistor region, the second P-type transistor region is located above the first P-type transistor region, the second N-type transistor region is located above the second P-type transistor region, and the NAND gate region is adjacent to the first P-type transistor region, the second P-type transistor region, and the first N-type transistor region; and
the first P-type transistor region comprises a first region and a second region, the second P-type transistor region comprises a third region and a fourth region, the first region is horizontally symmetrical to the second region, a gate extension direction of a P-type transistor in the first region is the same as a gate extension direction of a P-type transistor in the second region, the third region is horizontally symmetrical to the fourth region, and a gate extension direction of a P-type transistor in the third region is the same as a gate extension direction of a P-type transistor in the fourth region.

2. The layout of the semiconductor structure according to claim 1, wherein the gate extension direction of the P-type transistor in the first region is the same as the gate extension direction of the P-type transistor in the third region, and a size of the first region is different from a size of the third region.

3. The layout of the semiconductor structure according to claim 2, wherein the NAND gate region comprises a third P-type transistor region, wherein
the third P-type transistor region is located between the first region and the second region, the third P-type transistor region is also located between the third region and the fourth region, and a gate extension direction of a P-type transistor in the third P-type transistor region is the same as the gate extension direction of the P-type transistor in the first region.

4. The layout of the semiconductor structure according to claim 3, wherein the semiconductor structure further comprises a capacitor region, wherein
the capacitor region is located above the third P-type transistor region, the capacitor region is located between the first region and the second region, and the capacitor region is also located between the third region and the fourth region.

5. The layout of the semiconductor structure according to claim 1, wherein the semiconductor structure further comprises a closed N guard ring, wherein
the closed N guard ring surrounds peripheries of the first P-type transistor region and the second P-type transistor region.

6. The layout of the semiconductor structure according to claim 1, wherein the first N-type transistor region comprises a fifth region and a sixth region, wherein
the fifth region is horizontally symmetrical to the sixth region, and a gate extension direction of an N-type transistor in the fifth region is the same as a gate extension direction of an N-type transistor in the sixth region.

7. The layout of the semiconductor structure according to claim 6, wherein the NAND gate region further comprises a third N-type transistor region and a fourth N-type transistor region, wherein
the third N-type transistor region is located below the fifth region, and the fourth N-type transistor region is located below the sixth region.

8. The layout of the semiconductor structure according to claim 7, wherein a gate extension direction of an N-type transistor in the third N-type transistor region is the same as the gate extension direction of the N-type transistor in the fifth region, and a width, in the gate extension direction, of the N-type transistor in the third N-type transistor region is equal to a width, in the gate extension direction, of the N-type transistor in the fifth region; and
a gate extension direction of an N-type transistor in the fourth N-type transistor region is the same as the gate extension direction of the N-type transistor in the sixth region, and a width, in the gate extension direction, of the N-type transistor in the fourth N-type transistor region is equal to a width, in the gate extension direction, of the N-type transistor in the sixth region.

9. The layout of the semiconductor structure according to claim 7, wherein a gate extension direction of an N-type transistor in the third N-type transistor region is perpendicular to the gate extension direction of the N-type transistor in the fifth region, and a width, in the gate extension direction, of the N-type transistor in the third N-type transistor region is greater than a width, in the gate extension direction, of the N-type transistor in the fifth region; and a gate extension direction of an N-type transistor in the fourth N-type transistor region is perpendicular to the gate extension direction of the N-type transistor in the sixth region, and a width, in the gate extension direction, of the N-type transistor in the fourth N-type transistor region is greater than a width, in the gate extension direction, of the N-type transistor in the sixth region.

10. The layout of the semiconductor structure according to claim 7, wherein the semiconductor structure further comprises a first P guard ring with a first opening, wherein the first P guard ring surrounds three sides of a region formed by the first N-type transistor region, the third N-type transistor region, and the fourth N-type transistor region, and the first opening faces towards the first P-type transistor region.

11. The layout of the semiconductor structure according to claim 1, wherein the second N-type transistor region comprises a seventh region and an eighth region, wherein the seventh region is horizontally symmetrical to the eighth region, and a gate extension direction of an N-type transistor in the seventh region is the same as a gate extension direction of an N-type transistor in the eighth region.

12. The layout of the semiconductor structure according to claim 11, wherein the semiconductor structure further comprises a second P guard ring with a second opening and a third P guard ring with a third opening, wherein the second P guard ring surrounds three sides of the seventh region, the second opening faces towards the second P-type transistor region, the third P guard ring surrounds three sides of the eighth region, and the third opening faces towards the second P-type transistor region.

13. The layout of the semiconductor structure according to claim 1, wherein a potential of a substrate terminal of the first P-type transistor region is equal to a potential of a substrate terminal of the second P-type transistor region.

14. The layout of the semiconductor structure according to claim 1, wherein the semiconductor structure further comprises a memory array, wherein the memory array is located above the column decoder, and a width of the memory array in a direction from left to right is equal to a width of the column decoder in the direction from left to right.

15. The layout of the semiconductor structure according to claim 14, wherein the column decoder further comprises an output metal line, wherein the output metal line extends from bottom to top, one end of the output metal line is connected to a drain of the second P-type transistor region, and a second end of the output metal line is connected to a column selection line of the memory array.

16. A layout of a semiconductor structure, comprising: a column decoder and a closed N guard ring, wherein the column decoder comprises a first P-type transistor region, a second P-type transistor region, a first N-type transistor region, a second N-type transistor region, and a NAND gate region;

the first P-type transistor region is located above the first N-type transistor region, the second P-type transistor region is located above the first P-type transistor region, the second N-type transistor region is located above the second P-type transistor region, and the NAND gate region is adjacent to the first P-type transistor region, the second P-type transistor region, and the first N-type transistor region; and the closed N guard ring surrounds peripheries of the first P-type transistor region and the second P-type transistor region.

17. A layout of a semiconductor structure, comprising: a column decoder, wherein the column decoder comprises a first P-type transistor region, a second P-type transistor region, a first N-type transistor region, a second N-type transistor region, and a NAND gate region;

the first P-type transistor region is located above the first N-type transistor region, the second P-type transistor region is located above the first P-type transistor region, the second N-type transistor region is located above the second P-type transistor region, and the NAND gate region is adjacent to the first P-type transistor region, the second P-type transistor region, and the first N-type transistor region; and a potential of a substrate terminal of the first P-type transistor region is equal to a potential of a substrate terminal of the second P-type transistor region.

* * * * *